US009217927B2

(12) United States Patent
Lee et al.

(10) Patent No.: US 9,217,927 B2
(45) Date of Patent: Dec. 22, 2015

(54) METHOD FOR MANUFACTURING MICRO STRUCTURE USING X-RAY EXPOSURE

(75) Inventors: Bong-Kee Lee, Ulsan (KR); Dong Sung Kim, Pohang (KR); Tai-Hun Kwon, Pohang-si (KR); Young Ok Lee, legal representative, Pohang-si (KR)

(73) Assignee: POSTECH ACADEMY-INDUSTRY FOUNDATION, Pohang (KR)

( * ) Notice: Subject to any disclaimer, the term of this patent is extended or adjusted under 35 U.S.C. 154(b) by 174 days.

(21) Appl. No.: 13/128,016

(22) PCT Filed: Nov. 2, 2009

(86) PCT No.: PCT/KR2009/006385
§ 371 (c)(1),
(2), (4) Date: May 6, 2011

(87) PCT Pub. No.: WO2010/053277
PCT Pub. Date: May 14, 2010

(65) Prior Publication Data
US 2011/0254195 A1 Oct. 20, 2011

(30) Foreign Application Priority Data
Nov. 7, 2008 (KR) .................. 10-2008-0110582

(51) Int. Cl.
*G03F 7/20* (2006.01)
*B81C 99/00* (2010.01)
*G03F 7/00* (2006.01)

(52) U.S. Cl.
CPC ............ *G03F 7/2039* (2013.01); *B81C 99/009* (2013.01); *G03F 7/00* (2013.01)

(58) Field of Classification Search
USPC .......................................... 430/394, 316, 967
See application file for complete search history.

(56) References Cited

FOREIGN PATENT DOCUMENTS

| CN | 1531019 | 9/2004 |
|---|---|---|
| KR | 10-2002-0024352 | 3/2002 |
| KR | 10-0451433 | 4/2003 |

OTHER PUBLICATIONS

R.K. Kupka, et al., "Microfabrication: LIGA-X and applications", Applied Surface Science, vol. 164, pp. 97-110, Dec. 31, 2000.
Perennes F, et al., "Sharp beveled tip hollow microneedle arrays fabricated by LIGA and 3D soft lithography with polyvinyl alcohol", Journal of Micromechanics and Microengineering IOP Publishing UK, vol. 16, No. 3, Jan. 25, 2006, pp. 473-479.
Database Inspec [Online] The Institution of Electrical Engineers, Stevenage, GB; 1999, Schulze J, et al., "Parallel optical interconnection using self-adjusting microlenses on injection-molded ferrules made by LIGA technique", Database accession No. 6516034; & Design and Engineering of Optical Systems II May 25-27, 1999 Berlin, Germany, Proceedings of the SPIE—The International Society for Optical Engineering, vol. 3737, May 1999, pp. 562-571.
Hui You, et al, "Deep x-ray exposure system with multistage for 3-D microfabrication", Micromechatronics and Human Science, 2000. MHS 2000. Proceedings of 20 00 International Symposium on Oct. 22-25, 2000, Piscataway, NJ, USA, IEEE, Oct. 22, 2000, pp. 53-58.

*Primary Examiner* — Daborah Chacko Davis
(74) *Attorney, Agent, or Firm* — Lex IP Meister, PLLC

(57) ABSTRACT

Provided is a method for fabricating a microstructure. The method includes disposing an X-ray mask on photosensitive material and exposing the photosensitive material by radiating X-rays to the photosensitive material, etching the exposed photosensitive material, forming a mold having a micro-pattern by filing the etched photosensitive material with metal, forming a mold module by combining a plurality of molds, and forming a microstructure using the mold module.

8 Claims, 14 Drawing Sheets

METHOD FOR MANUFACTURING MICRO STRUCTURE USING X-RAY EXPOSURE

TECHNICAL FIELD

The present invention relates to a microstructure fabricating method and, more particularly, to a microstructure fabricating method using an x-ray exposure scheme.

BACKGROUND ART

LIGA is a fabrication technology used to create a plastic microstructure using high energy x-rays generated by a synchrotron. LIGA was developed in the early 1980s at Germany. Many studies have been made for advancing LIGA and applications thereof. LIGA is a German acronym for Lithographie, Galvanoformung, and Abformung. That is, LIGA includes a Lithographie process for fabricating a plastic microstructure through X-ray exposure, a Galvanoformung process for forming a mold insert using electro forming, and an Abformung process for forming a microstructure using the mold insert. LIGA was developed for mass production with high productivity, not designed for one time production of a microstructure.

A micro-electro-mechanical system (MEMS) technology uses an ultraviolet rays (UV) exposure scheme to fabricate a microstructure. Unlike the conventional MEMS technology, LIGA uses high energy X-rays to fabricate a microstructure. Due to the high energy X-rays, a microstructure having a high aspect ratio can be fabricated using LIGA. Furthermore, a microstructure fabricated by LIGA has excellent surface quality. LIGA has been used to produce micro components for optical communication, such as an optical waveguide and an optical connector, precise mechanical parts such as micro motor, and a core part for a heat exchanger and a micro reactor.

In early development stage, a Deep X-ray Lithography (DXRL) process using high energy x-rays was mainly used. Henceforth, a UV-LIGA process using a UV exposure scheme was introduced and used more as a micro-electro-mechanical system (MEMS) technology has been advanced.

In LIGA, a microstructure having the same shape of a final product is formed at first through an exposure process. Using the formed microstructure as a mother structure, a mold or a mold insert is formed by performing an electro forming process.

The final product having the same shape of the initially produced microstructure can be mass-produced through a molding process using the mold.

In order to mass-produce various microstructures through LIGA, It is necessary to precisely produce a mold or a mold insert. Furthermore, the mold must have a high dimensional accuracy and required mechanical properties as well as a shape of final product. Such requirements must be satisfied in order to stably mass-produce final products.

Recently, various microstructure fabricating technologies have been used to produce molds or mold inserts for mass-productions of various microstructures. A mold may be produced using a precision machining process or a laser process that directly processes mold material to form a mold. However, the precision machining process or the laser process has drawbacks such as low dimensional accuracy and long production time. Due to such drawbacks, an exposure process in a semiconductor process has been generally used. A microstructure is produced through an exposure process, and a metal mold or a metal mold insert is then produced by performing an electro forming process on the fabricated microstructure.

As the MEMS technology has been advanced, various exposure processes have been introduced. Such exposure process has merits of process automation, high dimensional accuracy, and high yield. A microstructure fabricated through typical exposure process has a planar shape. It is because a direction of radiating light is vertical to a substrate and photosensitive material coated on the substrate. Accordingly, it is difficult to produce a microstructure having various 3-D shapes of different heights of inclined planes in case of the vertical exposure scheme.

A microstructure having a constant slope can be manufactured through a method for radiating light using an inclined exposure scheme. However, only limited microstructures can be produced using the inclined exposure scheme. Further, it is very difficult to manufacture a mask used for the inclined exposure scheme, and complicated equipment is additionally required to use the inclined exposure scheme. Accordingly, the inclined exposure scheme has been used only for specific cases.

Moreover, the inclined exposure scheme also has limitation in depth exposed by X-rays. Accordingly, it is impossible to produce a microstructure having a complicated shaped in a width direction thereof using the inclined exposure scheme.

The above information disclosed in this Background section is only for enhancement of understanding of the background of the invention and therefore it may contain information that does not form the prior art that is already known in this country to a person of ordinary skill in the art.

DISCLOSURE

Technical Problem

The present invention has been made in an effort to provide a microstructure fabricating method having advantages of easily fabricating microstructures having various shapes.

Technical Solution

An exemplary embodiment of the present invention provides a method for fabricating a microstructure including disposing an X-ray mask on photosensitive material and exposing the photosensitive material by radiating X-rays to the photosensitive material, etching the exposed photosensitive material, forming a mold having a micro-pattern by filing the etched photosensitive material with metal, forming a mold module by combining a plurality of molds, and forming a microstructure using the mold module.

In the exposing the photosensitive material, a Deep X-Ray Lithography (DXRL) process may be performed to expose the photosensitive material. The plurality of molds may have micro-patterns different in shape. The forming a mold may include electro forming. In the forming a mold, metal may be one of nickel and nickel alloy.

The micro-pattern may be a three dimensional (3-D) micro-pattern having an irregular height of a top side. The X-ray mask may have a pattern shape corresponding to a shape of a side of the microstructure. The plurality of molds may be arranged and stacked in a length direction of the micro-pattern.

Another exemplary embodiment of the present invention provides a method for fabricating a microstructure, including disposing an X-ray mask on photosensitive material and exposing the photosensitive material by radiating X-rays, etching the exposed photosensitive material, forming a photosensitive module by arranging and stacking the etched photosensitive materials, forming a mold having a micro-pattern by filling the photosensitive module with metal, and forming a microstructure using the mold.

In the exposing the photosensitive material, a Deep X-Ray Lithography (DXRL) process may be performed to expose the photosensitive material. Micro-patterns may be formed at the etched photosensitive materials, and the micro-patterns may be different from each other in shape.

The photosensitive materials may be arranged and stacked in a length direction of the micro-pattern. The forming a mold may include electro forming.

In the forming a mold, metal may be one of nickel and nickel alloy. The micro-pattern may be a three dimensional (3-D) micro-pattern having an irregular height of a top side.

The X-ray mask may have a pattern having a shape corresponding to a shape of a side of the microstructure. A protrusion may be formed at a corner of the photosensitive material to support neighbor photosensitive material, and the protrusion is protruded upwardly from a top side of the photosensitive material or downwardly from a bottom side of the photosensitive material.

Advantageous Effects

According to the present exemplary embodiment, a microstructure having a 3-D shaped micro-pattern can be easily fabricated.

MODE FOR INVENTION

Figure 1:
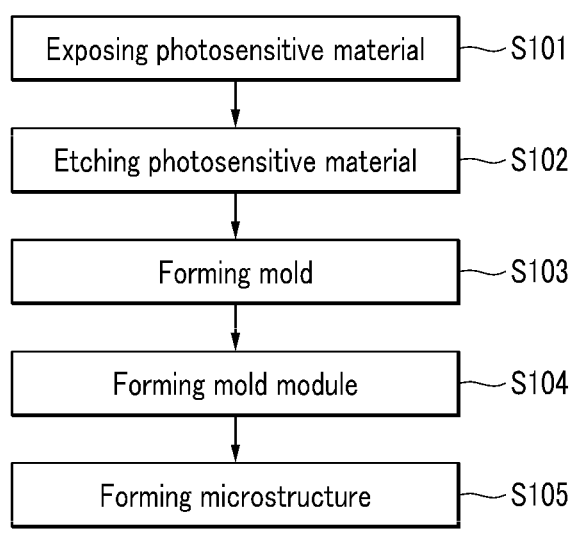
FIG. 1 is a flowchart that illustrates a method for fabricating a microstructure according to the first exemplary embodiment of the present invention.

In the present invention, "micro-pattern" or "microstructure" means a pattern or a structure having a nano size pitch or a micro size pitch.

In the following detailed description, only certain exemplary embodiments of the present invention have been shown and described, simply by way of illustration. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

FIG. 1 is a flowchart that illustrates a method for fabricating a microstructure according to the first exemplary embodiment of the present invention. FIGS. 2A to 2F is diagrams for describing the method for fabricating a microstructure according to the first exemplary embodiment of the present invention.

Referring to FIG. 1, the microstructure fabricating method according to the present exemplary embodiment includes exposing photosensitive material 110 at step S101, etching the photosensitive material 110 at step S102, forming a mold at step S103, forming a mold module at step S104, and fabricating a microstructure at step S105.

Figure 2A:
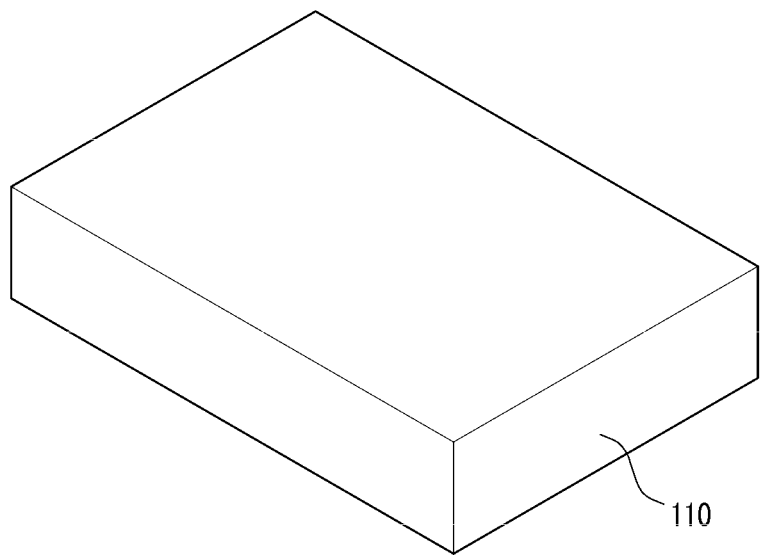
FIGS. 2A to 2F is diagrams for describing the method for fabricating a microstructure according to the first exemplary embodiment of the present invention.

As shown in FIG. 2A, photosensitive material 110 made of PMMA is prepared. In the present exemplary embodiment, a positive photosensitive material is used. A negative photosensitive material, however, may be used as the photosensitive material 110 as well as the positive photosensitive material.

Negative photosensitive material such as SU-8 stays in liquid. Accordingly, a substrate can be coated with negative photosensitive material at a predetermined thickness by performing spin coating. Then, soft baking is performed to solidify the negative photosensitive material coated on the substrate and to retain the solid state thereof.

Figure 2B:
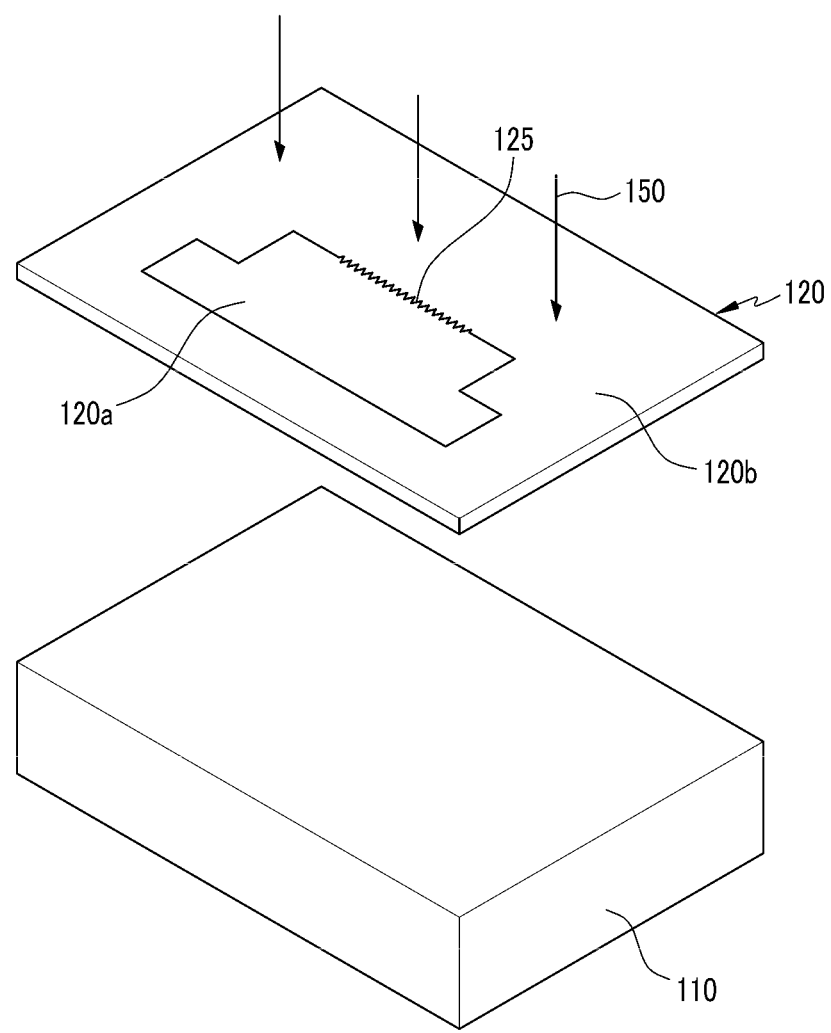

As shown in FIG. 2B, a X-ray mask 120 is disposed on the photosensitive material 110 and an x-ray exposure process is performed by radiating x-rays to the photosensitive material 110 at step S101.

The X-ray mask 120 includes an absorption part 120b for absorbing X-rays 150, and a penetration part 120a for not absorbing the X-rays. The absorption part 120b may be made of gold (Au) that absorbs the X-rays 150 very well and the penetration part 120a may be made of various materials that do not absorb the X-rays 150.

A predetermined pattern 125 is formed at the X-ray mask 120. The predetermined pattern corresponds to a shape of a side of a microstructure. The side of the microstructure may be a side that crosses and forms a corner with a top side of the microstructure, where a micro-pattern is protruded from the top side of the microstructure. When a microstructure has a quadrangle-shaped top side, a microstructure has four sides. The predetermined pattern in the X-ray mask 120 has a shape corresponding to that of a side of the microstructure where micro-patterns are continuously formed. In the present exemplary embodiment, the predetermined pattern has a shape identical to that of the penetration part 120a.

The X-ray mask 120 is disposed to face a predetermined side of the photosensitive material 110 and the X-rays 150 is radiated toward the X-ray mask 120.

The DXRL has merits of high penetration depth and easy thickness control. Particularly, a microstructure having high aspect ratio can be fabricated through a DXRL process using high energy X-rays. The DXRL process using high energy X-rays can be used to fabricate a vertical microstructure because of high collimation of the X-rays. Because it is possible to fabricate a microstructure with superior surface roughness, the DXRL process is used in the present exemplary embodiment.

Figure 2C:
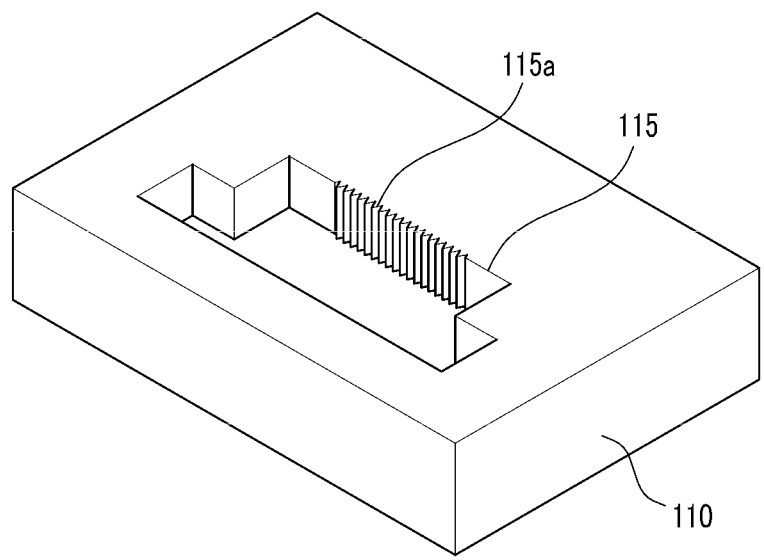

After radiating the X-ray 150, a pattern groove 115 having a micro-pattern 115a is formed by etching the photosensitive material 110 as shown in FIG. 2C. In the present exemplary embodiment, a positive photosensitive material is exposed at X-rays and a radiated part of the positive photosensitive material is etched. However, the present invention is not limited thereto. The present exemplary embodiment can be applied to negative photosensitive material.

The micro-pattern 115a extends in a depth direction of the pattern groove 115 because the pattern is formed in the X ray mask 120 corresponding to a side of the microstructure. The top side of the micro-pattern 115a is formed to be sloped.

Figure 2D:
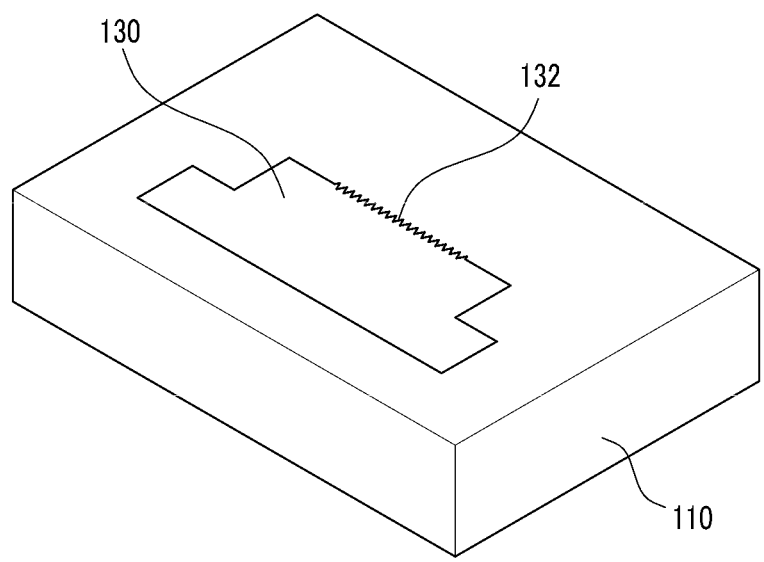

After forming the pattern groove 115, a mold 130 is formed by filling the pattern groove 115 with metal as shown in FIG. 2D. The mold 130 is made of nickel or nickel alloy. Since the nickel and nickel alloy have excellent mechanical strength, the nickel and nickel alloy are proper metal for fabricating a mold for mass production of a microstructure. An electro forming may be applied to fabricate the mold 130. A depth of the pattern groove 115 is about 2 mm. The pattern groove 115 may be easily filled with nickel using the electro forming.

Figure 2E:
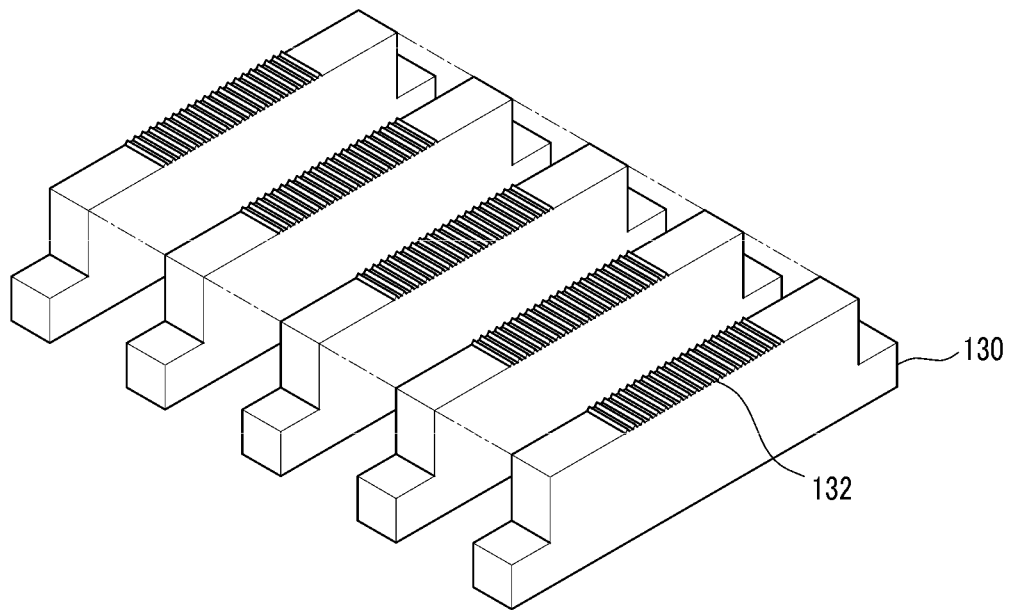

As shown in FIG. 2E, the mold 130 having a micro-pattern 132 is separated from the photosensitive material 110. A plurality of molds 130 are manufactured using the same method described above. Then, the plurality of molds 130 are arranged as shown in FIG. 2E.

As shown, the micro-pattern 132 is formed at a top side of the mold 130. A side shape of the mold 130 corresponds to the pattern formed in the X-ray mask 120.

Figure 2F:
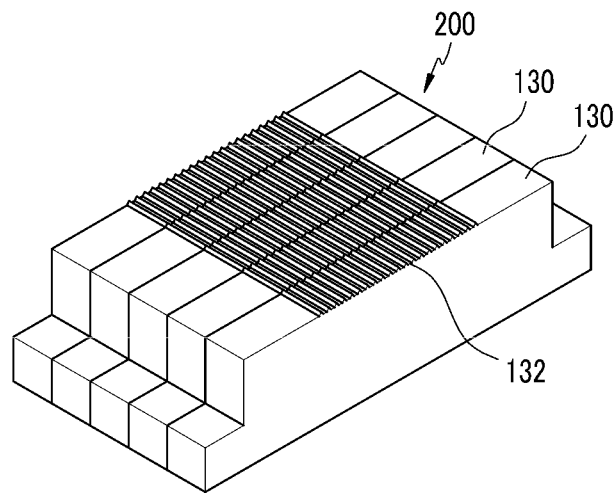

As shown in FIG. 2F, a mold module 200 is formed by combining the plurality of molds 130. The mold module 200 includes a lengthy-extended micro-pattern.

Due to penetration limitation of X-ray, it is difficult to form a lengthy-extended pattern. In the exemplary embodiment, the lengthy-extended micro-pattern is formed by stacking the plurality of molds. In this method, the mold module 200 having the lengthy-extended micro-pattern can be formed even. That is, the mold module 200 is formed by stacking the plurality of molds in a length direction of the micro-pattern.

Figure 2G:
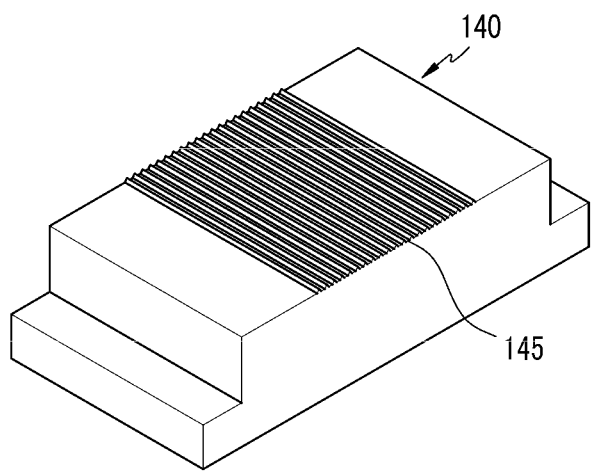

After forming the mold module, a microstructure 140 having a micro-pattern 145 is fabricated through an injection molding process or a hot embossing process as shown in FIG. 2G. The micro structure may be made of metal or polymer.

As described a 3-D micro-pattern having an irregular height of a top side can be fabricated according to the present exemplary embodiment.

Figure 3A:
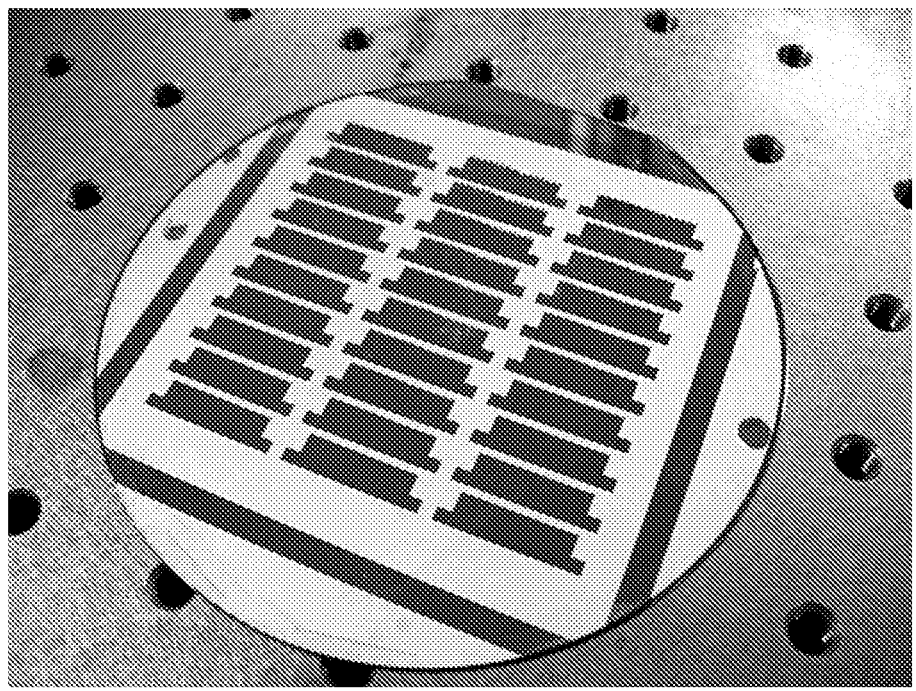
FIG. 3A is a picture of a X-ray mask fabricated according to the first exemplary embodiment of the present invention.
Figure 3B:
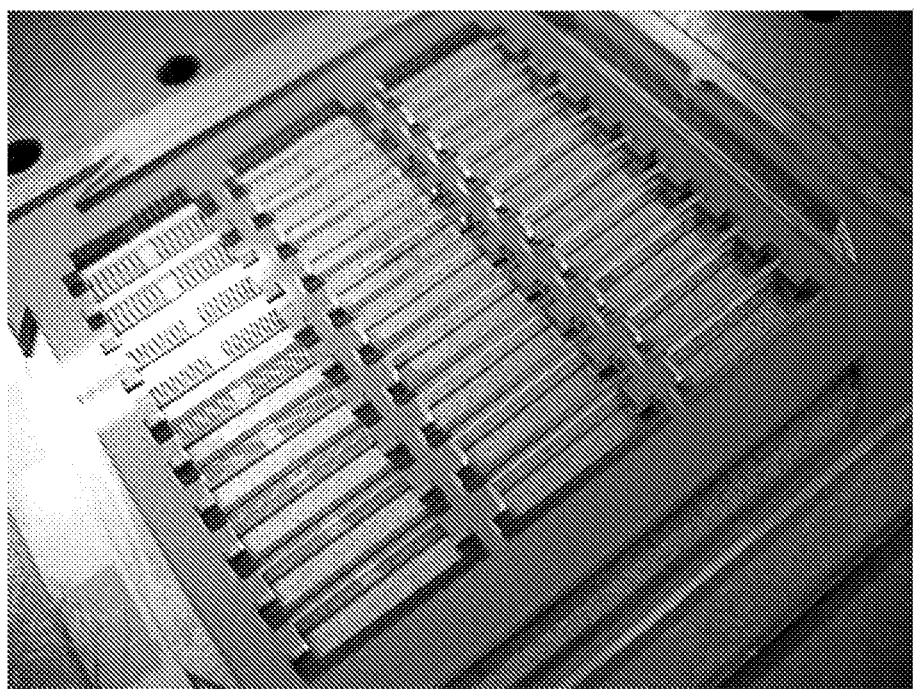
FIG. 3B is a picture showing a pattern groove formed using the X-ray mask of FIG. 3A.

FIG. 3A is a picture of a X-ray mask fabricated according to the first exemplary embodiment of the present invention, and FIG. 3B is a picture showing a pattern groove formed using the X-ray mask of FIG. 3A.

As shown in FIG. 3A, a X-ray mask includes a penetration part for passing X-rays through the X-ray mask and an absorption part for not passing X-rays through the X-ray mask.

As shown in FIG. 3B, a pattern groove is formed by performing exposure and etching after disposing the X-ray mask. Here, the pattern groove has a depth of about 2 mm. A mold is formed by filling the pattern groove using an electro forming process.

Figure 4A:
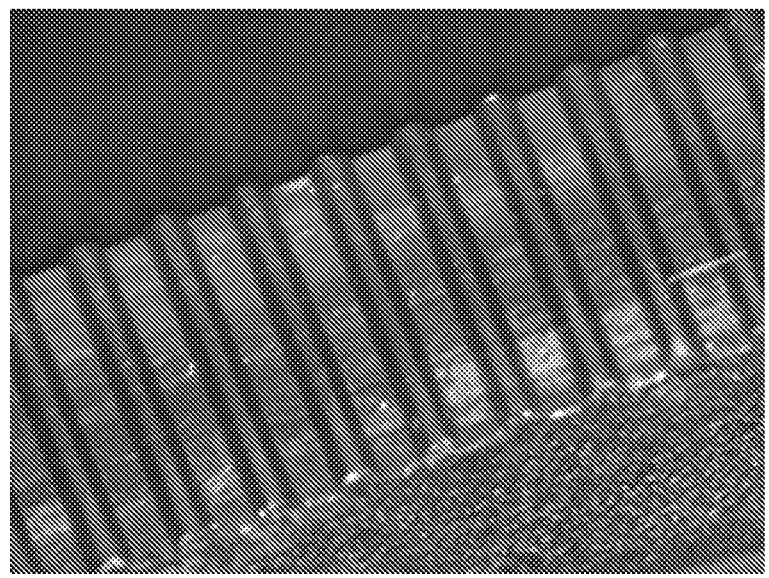
FIGS. 4A and 4B are pictures showing a mold module produced according to the first exemplary embodiment of the present invention.
Figure 4B:
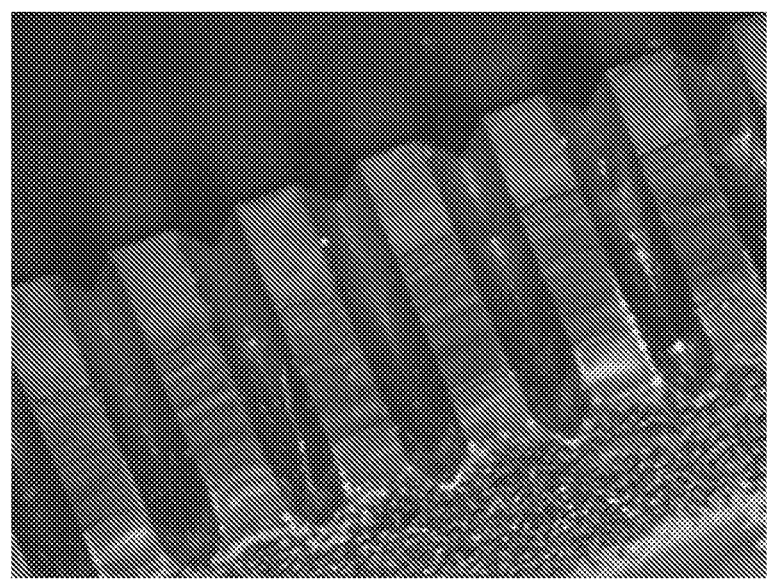

FIGS. 4A and 4B are pictures showing a mold module produced according to the first exemplary embodiment of the present invention.

FIG. 4A illustrates a mold module having a micro-pattern formed in a semicircle pillar shape. Here, a diameter of the semicircle pillar shaped pattern is about 200 μm. FIG. 4B illustrates a mold module having a micro-pattern formed in an equilateral triangle prism shape. Here, a length of one side of the micro-pattern is about 300 μm.

Figure 5:
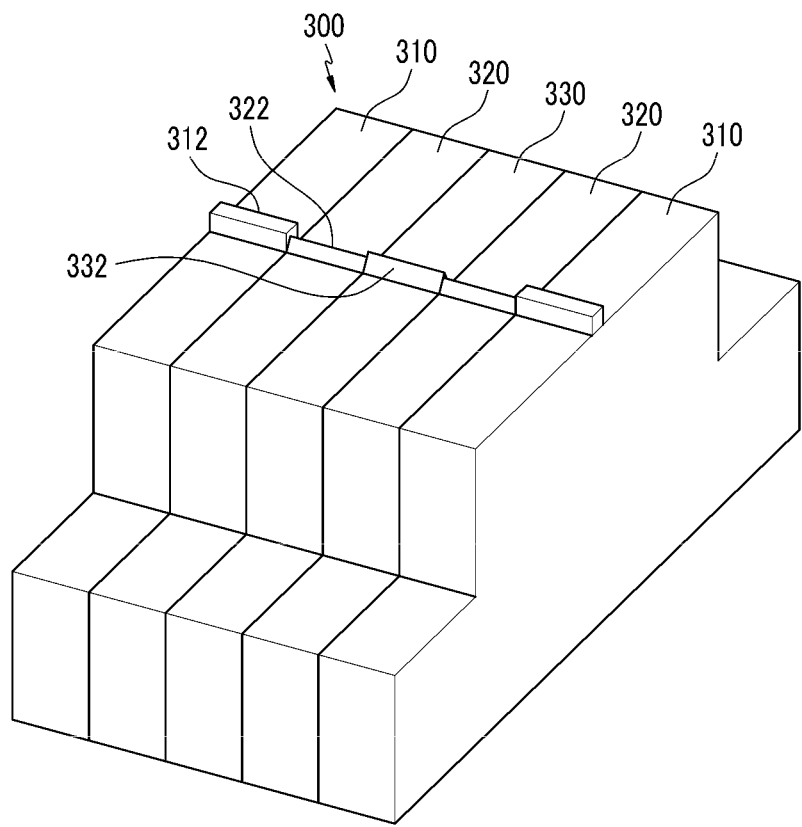
FIG. 5 is a perspective view of a mold module manufactured according to the second exemplary embodiment of the present invention.

FIG. 5 is a perspective view of a mold module manufactured according to the second exemplary embodiment of the present invention.

A mold module 300 according to the present exemplary embodiment includes a plurality of molds 310, 320, and 330. The molds 321, 320, and 330 include micro-patterns 312, 322, and 332, respectively. The micro-patterns 312, 322, and 332 are different from each other in shape. The mold module 300 according to the present exemplary embodiment includes a first mold 310, a second mold 320, and a third mold 330. The first mold 310 has a rectangular parallelepiped shape micro-pattern 312. The second mold 320 and the third mold 330 have triangle shape micro-patterns 322 and 332. Further, the micro-pattern 322 of the second mold 320 has a height higher than that of the micro-pattern 332 of the third mold 330.

In the present exemplary embodiment, a plurality of X-ray masks and photosensitive material are prepared to form molds having different shapes in order to form the mold module 300 having the micro-patterns 312, 322, and 332 having different shapes.

Such a mold module can be formed by combining molds having different shaped micro-patterns. Accordingly, a microstructure having various micro-patterns can be manufactured according to the present exemplary embodiment.

Figure 6A:
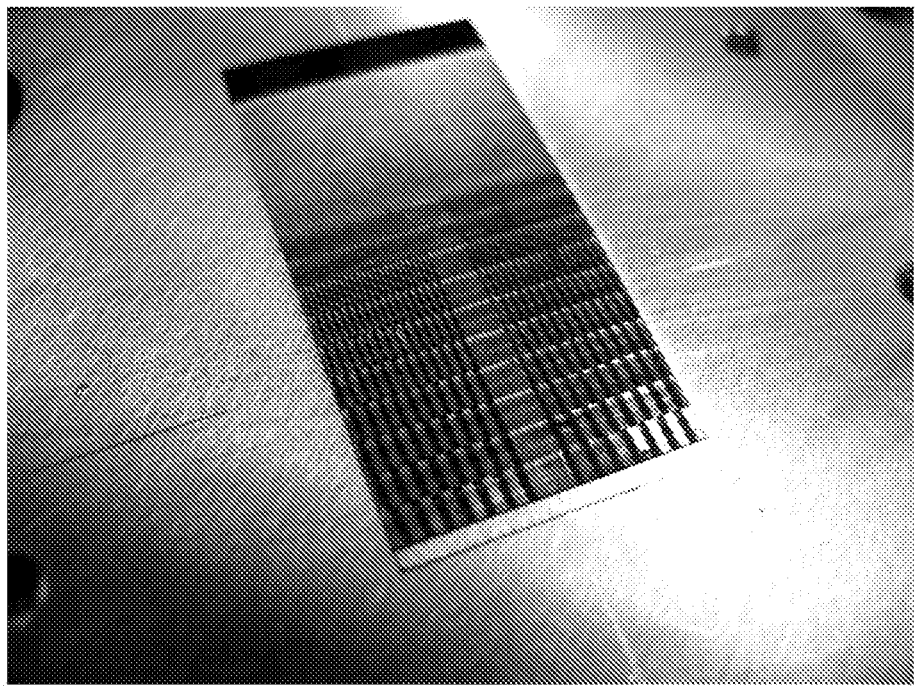
FIG. 6A is a picture that shows a mold core formed using a mold module manufactured according to the second exemplary embodiment of the present invention.
Figure 6B:
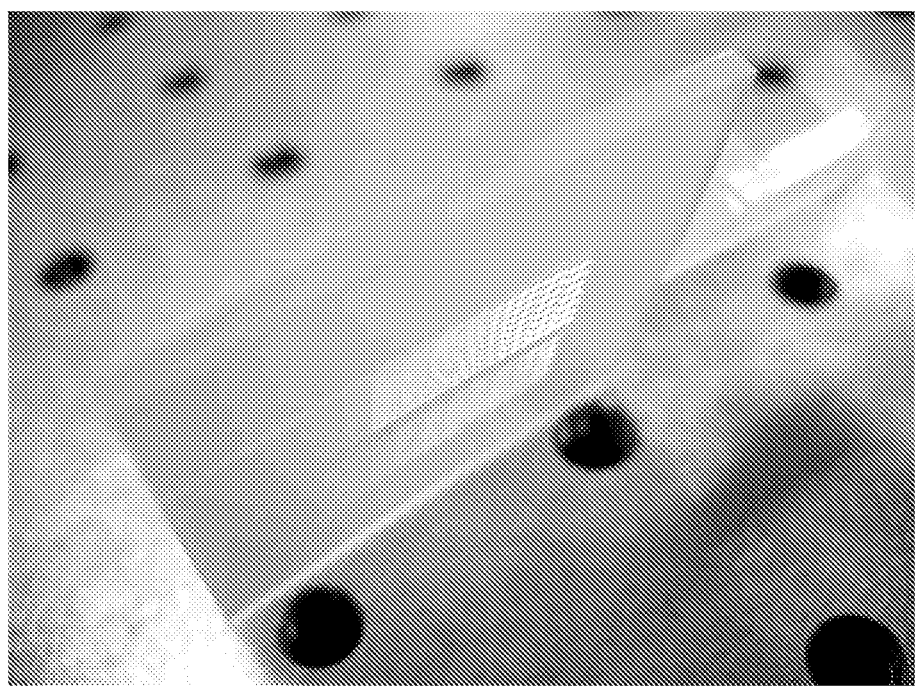
FIG. 6B is a picture that illustrates a polymer microstructure manufactured using the mold core of FIG. 6A.

FIG. 6A is a picture that shows a mold core formed using a mold module manufactured according to the second exemplary embodiment of the present invention, and FIG. 6B is a picture that illustrates a polymer microstructure manufactured using the mold core of FIG. 6A.

Referring to FIGS. 6A and 6B, micro-patterns formed on a mold core according to the present exemplary embodiment are gradually reduced in size. That is, such a microstructure can be fabricated using a mold module formed by combining molds micro-patterns different in size.

Figure 7A:
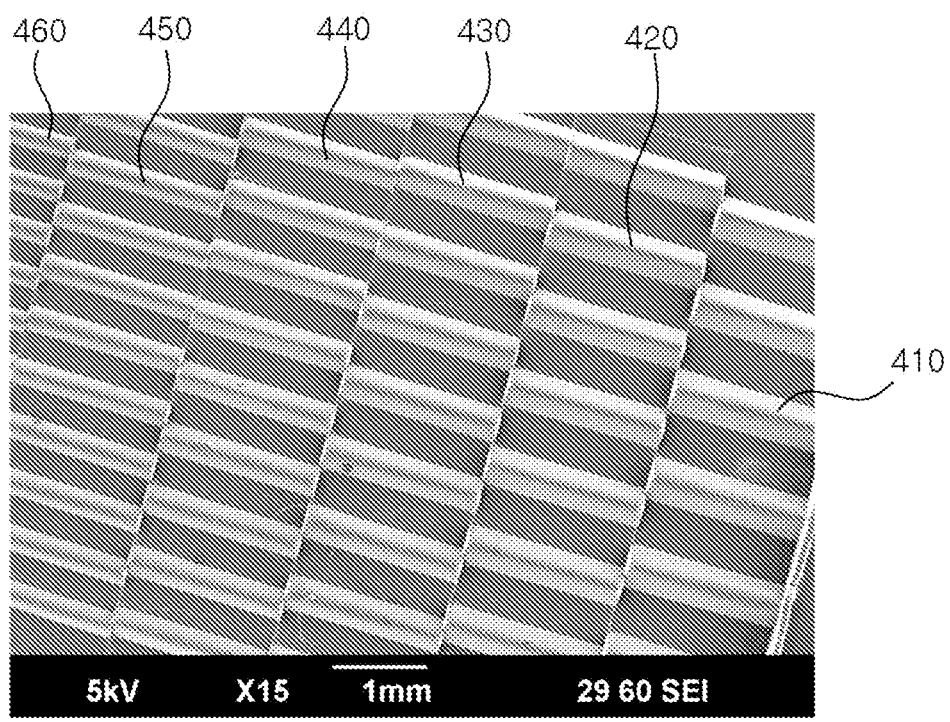
FIGS. 7A and 7B are pictures that illustrate a microstructure manufactured according to the second exemplary embodiment of the present invention.
Figure 7B:
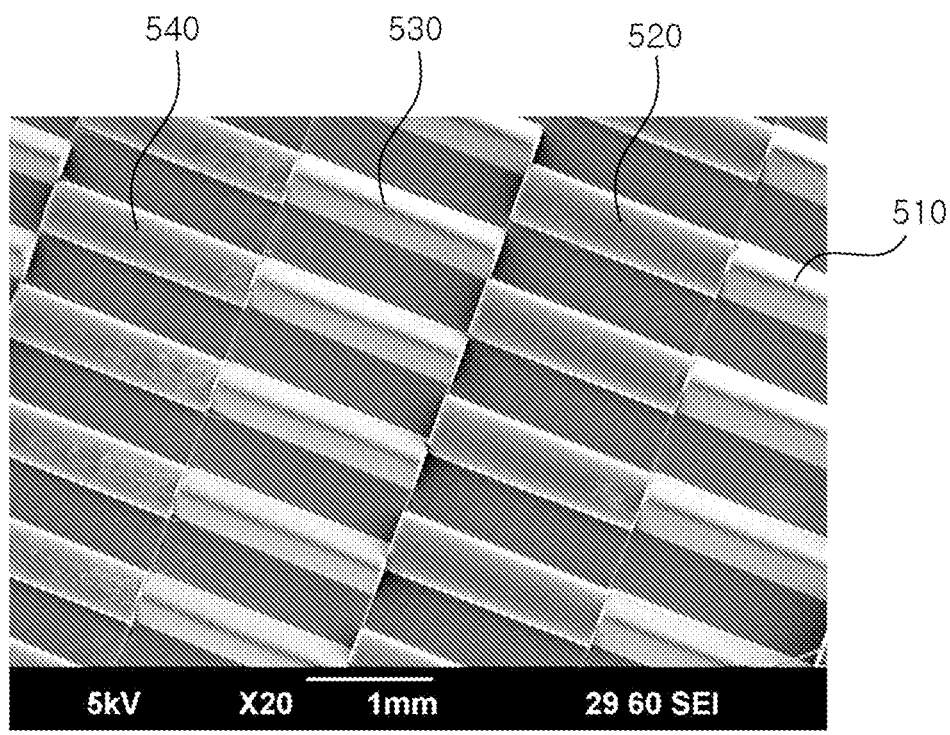

FIGS. 7A and 7B are pictures that illustrate a microstructure manufactured according to the second exemplary embodiment of the present invention.

Referring to FIG. 7A, a first micro-pattern 410 has an equilateral triangle shape and a length of one side is about 500 μm. A second micro-pattern 420 has an equilateral triangle shape and a length of one side is about 450 μm. A third micro-pattern 430 has an equilateral triangle shape and a length of one side is about 400 μm. A fourth micro-pattern 440 has an equilateral triangle shape and a length of one side is about 350 μm. A fifth micro-pattern 450 also has an equilateral triangle shape and a length of one side is about 300 μm. A sixth micro-pattern 460 has an equilateral triangle shape and a length of one side is about 250 μm.

Referring to FIG. 7B, a first micro-pattern 510 has an equilateral triangle shape and a length of one side is about 500 μm. A second micro-pattern 520 has a semicircular pillar shape and a diameter thereof is about 500 μm. A third micro-pattern 530 has an equilateral triangle shape and a length of one side is about 400 μm. A fourth micro-pattern 540 has a semicircular pillar shape and a diameter thereof is about 400 μm.

Microstructures having various shapes can be fabricated by combining molds having various micro-patterns as shown above.

Figure 8A:
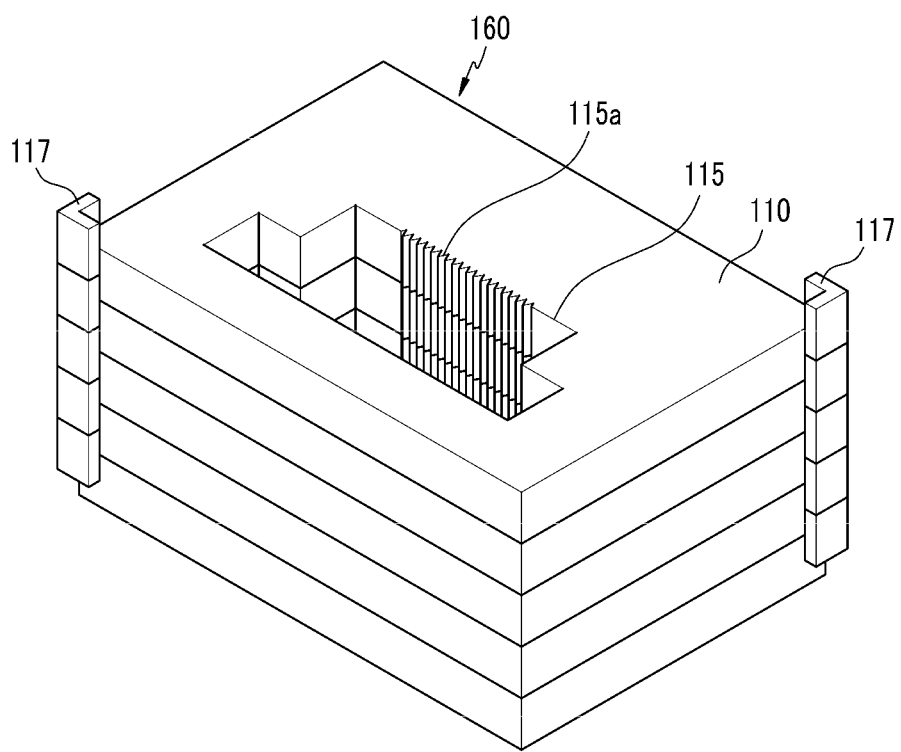
FIGS. 8A to 8C are diagrams that illustrate a method for fabricating a microstructure according to the third exemplary embodiment of the present invention.
Figure 8B:
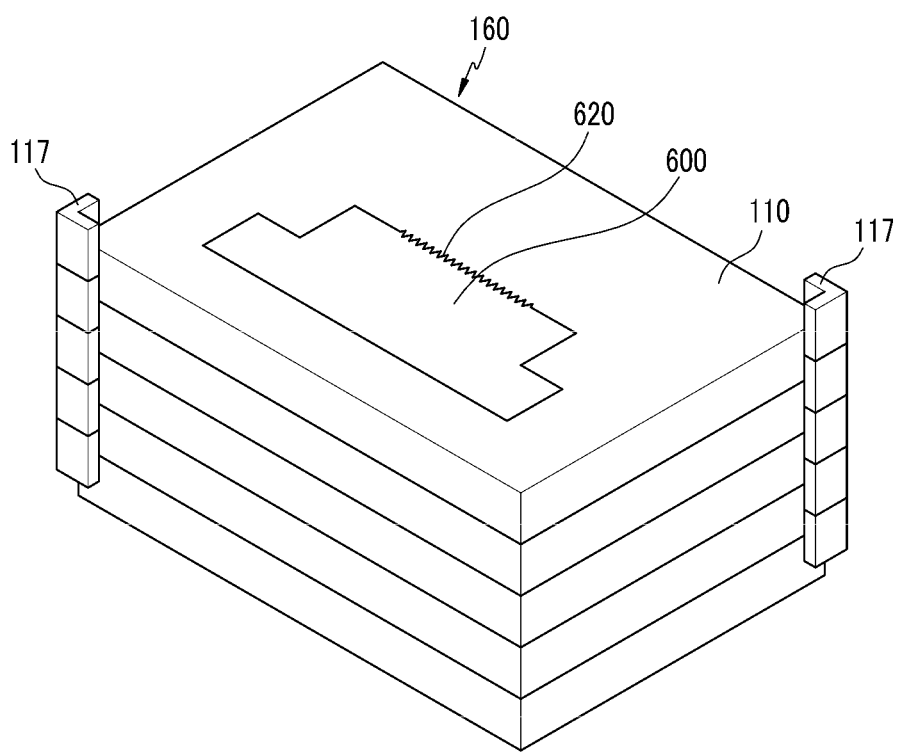
Figure 8C:
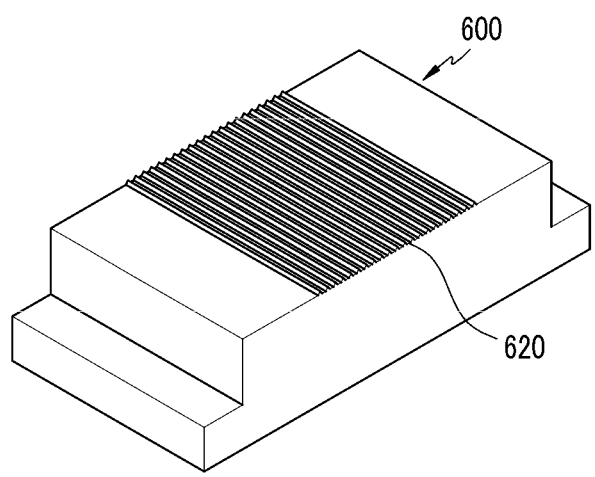

FIGS. 8A to 8C are diagrams that illustrate a method for fabricating a microstructure according to the third exemplary embodiment of the present invention.

The microstructure fabricating method according to the third exemplary embodiment includes exposing a photosensitive material and etching the exposed photosensitive material, which are identical to those of the first exemplary embodiment. Accordingly, the detailed descriptions thereof are omitted herein.

The microstructure fabricating method according to the present exemplary embodiment includes exposing a photosensitive material, etching the photosensitive material, forming a module by stacking photosensitive material layers, forming a mold, and forming a microstructure.

As shown in FIG. 8A, a photosensitive material layer 110 is exposed and etched to form a pattern groove 115 having a micro-pattern 115a in the photosensitive material 110. The pattern groove 115 penetrates the photosensitive material layer 110. The pattern groove 115 includes the micro-pattern 115a. A photosensitive material module 160 is formed by stacking photosensitive material layers 110 each having a pattern groove 115.

In order to properly stack the photosensitive material layers 110 at a predetermined position, a protrusion 117 is formed at a side of the photosensitive material layer 110. The protrusion 117 is protruded upwardly. Due to the protrusion 117, an upper photosensitive material layer can be properly positioned and stacked on a lower photosensitive material layer. The protrusion 117 may be formed at diagonal corners of the photosensitive material layer 110. The protrusion 117 has a shape bended along an edge of a corner. The protrusion 117 may be protruded upwardly from a top side or downwardly from a bottom side of the photosensitive material layer.

After stacking the photosensitive material layer 110, a mold 600 is formed by filling the pattern groove 115 with metal using an electro forming process as shown in FIG. 8B. The mold 600 is separated from the photosensitive material module as shown in FIG. 8C. The mold 600 includes a pattern 620 having a lengthy-extended pattern 620.

As described above, the mold having a 3-D pattern with irregular height can be easily fabricated using the photosensitive material module 160 formed by stacking the photosensitive material layers 110 according to the present exemplary embodiment. Furthermore, a microstructure having a wide 3-D micro-pattern can be easily fabricated using the mold 600 according to the present exemplary embodiment.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A method for fabricating a microstructure, the method comprising;
    repeatedly disposing an X-ray mask on a photosensitive material layer of a plurality of photosensitive material layers comprising a plurality of substrates, and repeatedly exposing the photosensitive material layer of the plurality of photosensitive material layers by radiating X-rays such that each of the plurality of photosensitive material layers is exposed individually in a consecutive manner, wherein each of the plurality of photosensitive material layers is formed on a respectively corresponding substrate among the plurality of substrates;
    repeatedly etching the exposed photosensitive material layer of the plurality of exposed photosensitive material layers such that each of the plurality of exposed photosensitive material layers is etched individually in a consecutive manner;
    forming a photosensitive module by stacking the etched photosensitive material layer on another etched photosensitive material layer such that all of the individually etched photosensitive material layers are stacked to form the photosensitive module;
    forming a mold having a micro-pattern by filling the photosensitive module with metal; and
    forming a microstructure using the mold.

2. The method of claim 1, wherein in the exposing the photosensitive material layer, a Deep X-Ray Lithography (DXRL) process is performed to expose the photosensitive material layer.

3. The method of claim 1, wherein the forming a mold includes electroforming.

4. The method of claim 3, wherein in the forming the mold, the metal is one of nickel and nickel alloy.

5. A method for fabricating a microstructure, the method comprising:
    disposing an X-ray mask on a photosensitive material layer formed on a substrate and exposing the photosensitive material layer by radiating X-rays toward the X-ray mask disposed on the photosensitive material layer;
    etching the exposed photosensitive material layer;
    repeating the disposing and exposing, and the etching for each of a plurality of photosensitive material layers individually in a consecutive manner until all of the plurality of photosensitive material layers are etched;
    forming a photosensitive module by stacking the plurality of etched photosensitive material layers;
    forming a mold having a micro-pattern by filling the photosensitive module with metal; and
    forming a microstructure using the mold.

6. The method of claim 5, wherein in the exposing the photosensitive material layer, a Deep X-Ray Lithography (DXRL) process is performed to expose the photosensitive material layer.

7. The method of claim 5, wherein the forming the mold includes electroforming.

8. The method of claim 7, wherein in the forming the mold, the metal is nickel or nickel alloy.

* * * * *